United States Patent
Sheau Tung Wong et al.

(10) Patent No.: US 7,654,753 B2
(45) Date of Patent: Feb. 2, 2010

(54) OPTICAL SUBASSEMBLY FOR AN ELECTRO-OPTICAL ASSEMBLY

(75) Inventors: Tom Sheau Tung Wong, Singapore (SG); Adrianus J. P. van Haasteren, Singapore (SG); Tze Wei Lim, Singapore (SG)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/131,207

(22) Filed: Jun. 2, 2008

(65) Prior Publication Data

US 2009/0297103 A1    Dec. 3, 2009

(51) Int. Cl.
*G02B 6/36* (2006.01)
*H01L 33/00* (2006.01)

(52) U.S. Cl. ............... 385/93; 385/88; 385/92; 385/94; 257/98; 257/99; 257/100; 257/432; 257/433; 257/434

(58) Field of Classification Search .......... 385/93, 385/88, 92, 94; 257/98, 99, 100, 432, 433, 257/434
See application file for complete search history.

(56) References Cited

U.S. PATENT DOCUMENTS

| | | | | |
|---|---|---|---|---|
| 4,268,113 A * | 5/1981 | Noel, Jr. | ................... | 385/92 |
| 5,625,734 A * | 4/1997 | Thomas et al. | ................ | 385/88 |
| 5,768,456 A * | 6/1998 | Knapp et al. | ................... | 385/49 |
| 6,071,016 A * | 6/2000 | Ichino et al. | ................... | 385/92 |
| 6,330,377 B1 * | 12/2001 | Kosemura | ..................... | 385/14 |
| 6,331,992 B1 | 12/2001 | Gilliland et al. | | |
| 6,349,105 B1 | 2/2002 | Gilliland et al. | | |
| 6,416,238 B1 | 7/2002 | Gilliland et al. | | |
| 6,517,258 B1 * | 2/2003 | Keska et al. | .................. | 385/92 |
| 6,550,982 B2 * | 4/2003 | Auburger et al. | ............. | 385/88 |
| 6,550,983 B1 | 4/2003 | Gilliland et al. | | |
| 6,556,608 B1 | 4/2003 | Gilliland et al. | | |
| 6,626,585 B1 * | 9/2003 | Malone | ....................... | 385/88 |
| 6,659,659 B1 | 12/2003 | Malone | | |
| 6,676,302 B2 * | 1/2004 | Cheng et al. | .................. | 385/88 |
| 6,792,171 B2 * | 9/2004 | Hargis et al. | .................. | 385/14 |
| 6,888,169 B2 | 5/2005 | Malone et al. | | |
| 6,915,049 B2 * | 7/2005 | Murata | ........................ | 385/52 |
| 6,991,381 B2 * | 1/2006 | Kropp | ......................... | 385/88 |
| 7,045,824 B2 | 5/2006 | Malone et al. | | |
| 7,066,660 B2 | 6/2006 | Ellison | | |
| 7,270,488 B2 * | 9/2007 | Althaus et al. | ................ | 385/88 |
| 7,364,368 B2 * | 4/2008 | Kropp | ......................... | 385/89 |
| 7,403,676 B2 * | 7/2008 | Kurihara et al. | .............. | 385/14 |
| 2002/0197025 A1 * | 12/2002 | Vaganov et al. | ............... | 385/92 |
| 2003/0053762 A1 * | 3/2003 | Cheng et al. | .................. | 385/88 |
| 2004/0252951 A1 * | 12/2004 | Nagasaka et al. | ............ | 385/88 |
| 2005/0141584 A1 * | 6/2005 | Ohe et al. | .................... | 372/108 |

* cited by examiner

Primary Examiner—Ryan Lepisto

(57) ABSTRACT

Various embodiments of optical subassemblies, and arrangements and methods for manufacturing same, for an electro-optical assembly are disclosed. One embodiment comprises an optical subassembly for an electro-optical assembly. The optical subassembly comprises a printed circuit board, an optical semiconductor device, and an optical element. The printed circuit board has a first surface, a second surface, and an aperture therethrough. The optical semiconductor device is attached to the first surface with an active region exposed to the aperture. The optical element is attached to the second surface with an optical axis exposed to the aperture and optically aligned with the active region.

7 Claims, 8 Drawing Sheets

OPTICAL SUBASSEMBLY FOR AN ELECTRO-OPTICAL ASSEMBLY

BACKGROUND

In optical communication networks, it is often desirable to use modular electrical and/or optical components to reduce manufacturing costs. For example, it is common to use electro-optical assemblies to transmit and receive optical signals over optical fibers. A typical electro-optical assembly comprises various modular components combined in a package assembly. For example, a typical electro-optical assembly comprises a transmitter optical subassembly (TOSA), a receiver optical subassembly (ROSA), and an electronic subassembly. The TOSA generally comprises a light source for transmitting optical signals and control circuitry for modulating the light source according to an input digital data signal from the electronic subassembly. The TOSA also includes an optical lens for coupling the light signals from the light source of the TOSA to an optical fiber that may be connected to the TOSA housing. The ROSA generally comprises a photodiode for detecting optical signals and sensing circuitry for converting the optical signals to digital signals provided to the electronic subassembly. The TOSA and ROSA are typically formed in a subassembly having electrical connections for connecting to the electronic subassembly and plug-type receptacles for optically connecting to an optical fiber or fiber optic connector.

A common design approach is to attach the optical semiconductor device containing the light source to a TOSA lead frame or the photodiode to a ROSA lead frame. The anode and cathode of the optical semiconductor device are then connected to the lead frame via wire bonding processes. The lead frame and the optical semiconductor device may be encapsulated inside, for example, a clear mold compound via standard transfer molding process. The optical element, which is used to focus light, may be formed during the molding process and, thereby, directly integrated with the clear mold compound and positioned directly in front of an active region of the optical semiconductor device to improve coupling efficiency. The encapsulated TOSA or ROSA may be soldered to an electronics subassembly (ESA). The ESA may contain, for instance, a printed circuit board, a driver integrated circuit (IC), a receiver IC, and passive elements, such as resistors, capacitors, and inductors. The leads of the TOSA may be connected to the driver IC via conductive traces on the PCB, and the leads of the ROSA may be connected to the receiver IC via conductive traces on the PCB.

There are a number of disadvantages to these designs. The lead frame that is used to mount the light source and the photodiode is typically structurally weak and may be easily damaged during encapsulation. The coefficient of thermal expansion between the encapsulation compound and the metal lead frame may cause cracks and delamination may develop between the clear mold and the lead frame bonding surfaces, for example, during soldering of the leads to the ESA. The bond wire disadvantageously increases the overall thickness of the TOSA and the ROSA, and may increase yield loss due to bond wire breakage. Furthermore, the bond wires may partially obstruct light rays between the optics and the optical semiconductor device.

Thus, there remains a need in the art for improved designs for optical subassemblies used in opto-electronic assemblies.

SUMMARY

Various embodiments of optical subassemblies, and arrangements and methods for manufacturing same, for an electro-optical assembly are disclosed. One embodiment comprises an optical subassembly for an electro-optical assembly. The optical subassembly comprises a printed circuit board, an optical semiconductor device, and an optical element. The printed circuit board has a first surface, a second surface, and an aperture therethrough. The optical semiconductor device is attached to the first surface with an active region exposed to the aperture. The optical element is attached to the second surface with an optical axis exposed to the aperture and optically aligned with the active region.

Another embodiment is a method for making an optical subassembly for connecting to an electronic subassembly in an opto-electronic assembly. One such method comprises: providing a printed circuit board having opposing surfaces; making a hole in the printed circuit board; attaching an optical semiconductor device having a first optical axis to one of the opposing surfaces with the first optical axis aligned with the hole; and attaching an optical element having a second optical axis to the other of the opposing surfaces with the second optical axis aligned with the first optical axis and the aperture.

DETAILED DESCRIPTION

Various embodiments of optical subassemblies for electro-optical assemblies, and arrangements and methods for manufacturing same, are disclosed. One embodiment of an optical subassembly 100 generally comprises a printed circuit board 106 to which an optical semiconductor device 202 and an optical component 302 having an optical channel are attached and at least partially encapsulated by an enclosure 102. The optical semiconductor device 202 may incorporate any light-emitting element and/or light-receiving element. In this regard, the optical assembly 100 may be implemented as a transmitter optical subassembly (TOSA) and/or a receiver optical subassembly (ROSA). Embodiments of a TOSA may be implemented with a laser diode or a light emitting diode (LED), and embodiments of a ROSA may be implemented with a photodiode.

Figures 1, 2:
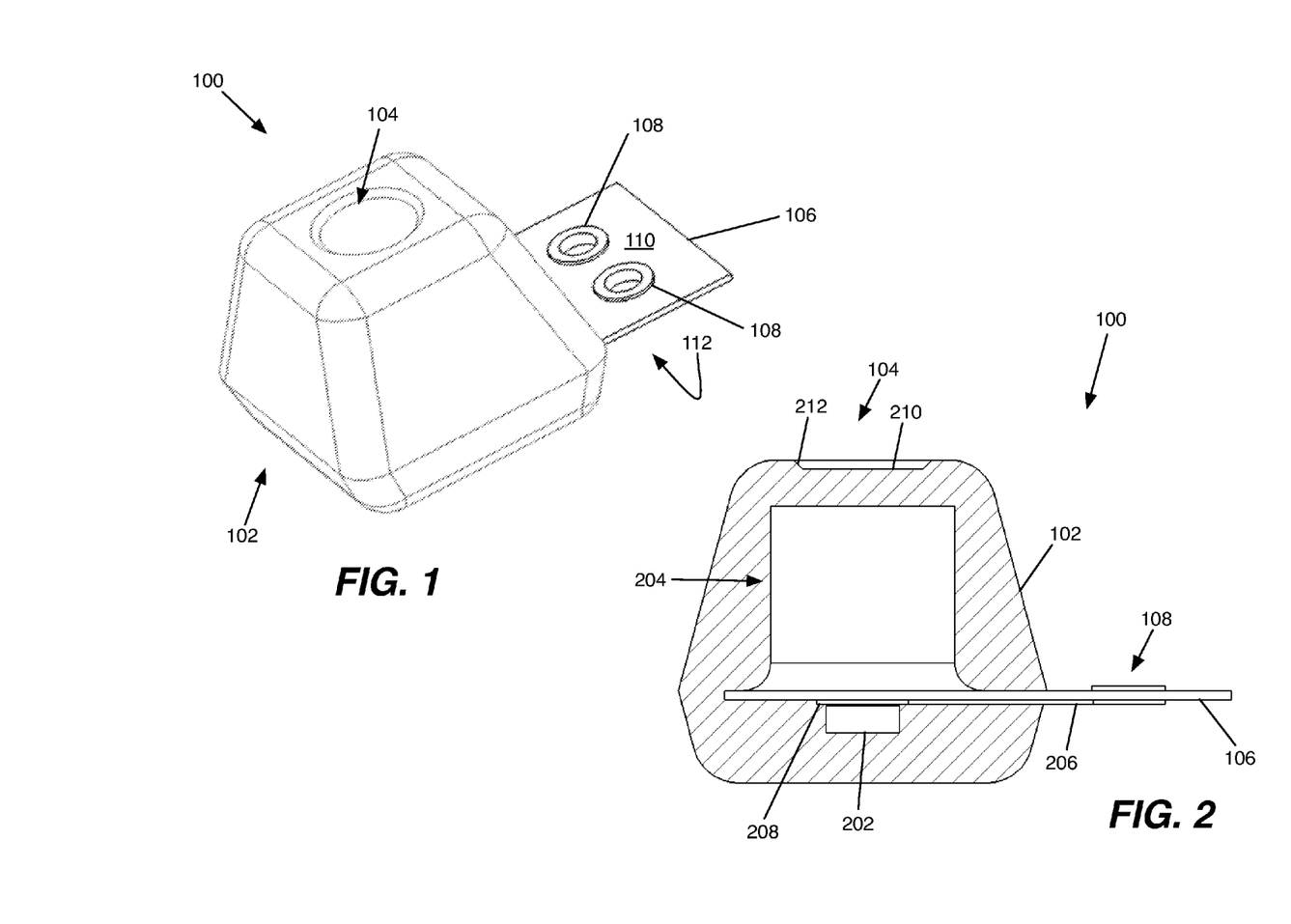
FIG. 1 is a perspective diagram of one embodiment of an optical subassembly adapted to connect to an electronic subassembly and form an electro-optical assembly.
FIG. 2 is a cross-sectional side view of the optical subassembly of FIG. 1.

A portion of the printed circuit board 106 may extend outside the enclosure 102 to expose electrical connectors (e.g., pin through-hole type connectors 108) for connecting the optical subassembly 100 to an electronic subassembly (not shown). It should be appreciated that the optical subassembly 100 may be configured in various ways to electrically connect to an electronic subassembly, including pin through-hole type connectors 108, other connectors, or any other means. The enclosure 102 may comprise any suitable material. In one embodiment, the enclosure 102 may be integrally formed from an optically clear polymer mold or other materials using, for example, injection molding or other manufacturing techniques. In other embodiments, the enclosure 102 may comprise separate components made of similar or other materials, which are joined together to at least partially encapsulate the optical subassembly 100. The enclosure 102 may include a port 104 adapted to receive a fiber ferrule. As best illustrated in FIG. 2, the port 104 may include a fiber ferrule alignment feature defined by a reference surface 210 and edges 212 for guiding the fiber ferrule to the reference surface 210. Other suitable plug-type, or other, connections may be used. The enclosure 102 encapsulates the optical semiconductor device 202, the optical component 204, and at least a portion of the printed circuit board 106.

The optical subassembly 100 incorporates a unique design for attaching the optical semiconductor device 202 and the optical component 204 to the printed circuit board 106. The unique design eliminates the need for wire bonding the optical semiconductor device 202 to the printed circuit board 106, and may reduce the package size, improve process yield, reduce manufacturing time, and reduce material costs. The optical subassembly 100 may replace the conventional metal lead frame with a printed circuit board 106. The PCB 106 may improve structural strength and rigidity. The coefficient of thermal expansion of the PCB 106 and the enclosure 102 may be closely matched and, thereby, may reduce or eliminate cracking and delamination issues. Furthermore, the TOSA and ROSA module thickness may be reduced by removing the need for bond wire. The reduced TOSA and ROSA module thickness may create extra space to accommodate other critical components inside the transceiver module, as well as reduce the external footprint of the transceiver module. Additionally, removing the bond wires may also eliminate the obstruction that may prevent direct placement of non-imaging optics, such as, for example, compound parabolic concentrator to improve coupling efficiency.

Figures 3, 4:
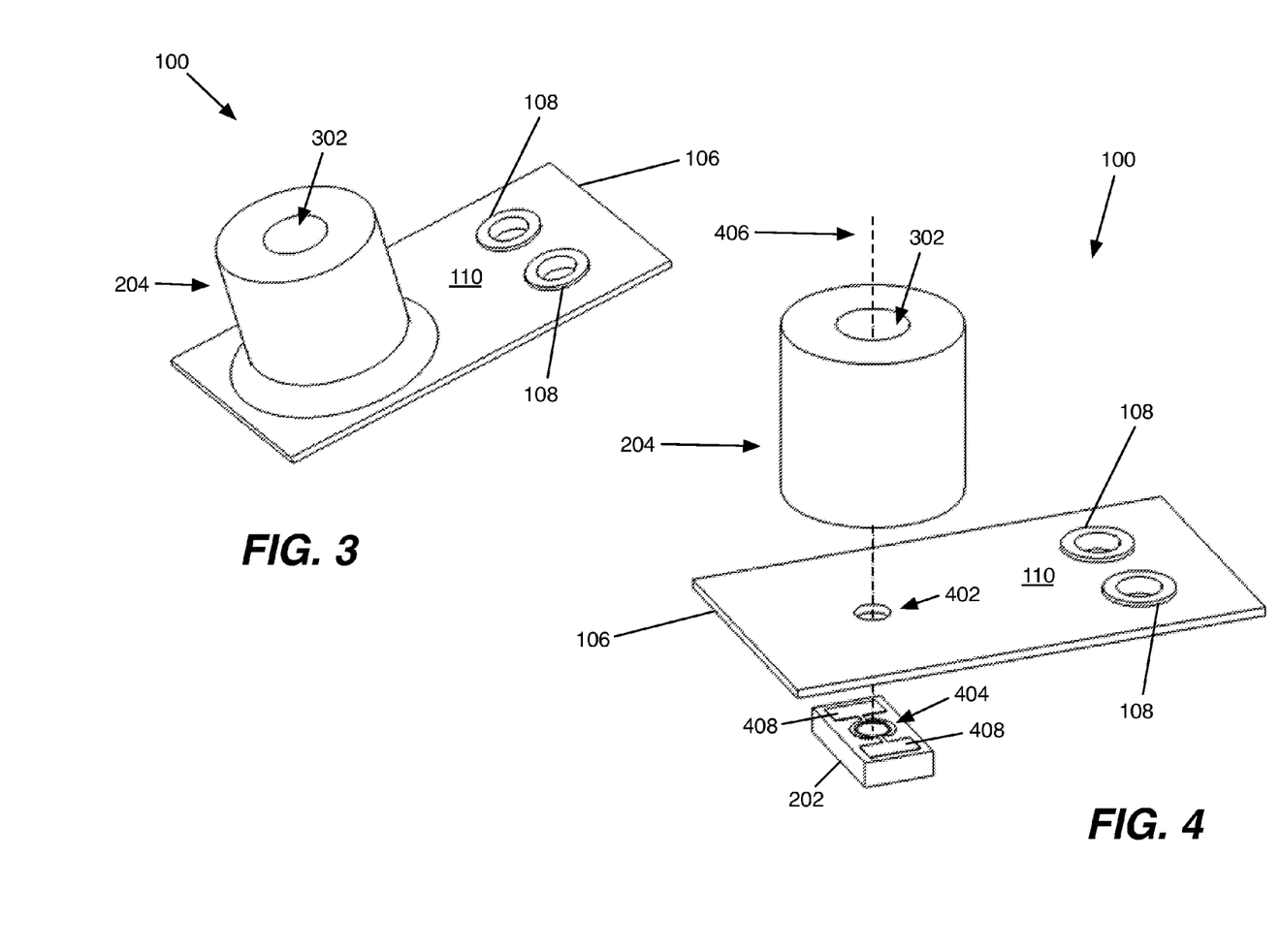
FIG. 3 is a perspective view of the optical subassembly of FIGS. 1 & 2 illustrating the components within the housing.
FIG. 4 is an exploded view of FIG. 3 illustrating the optical alignment of the optical element and the optical semiconductor device with the aperture in the printed circuit board.

The printed circuit board 106 has a pin through-hole feature (e.g., aperture 402) through which the optical semiconductor device 202 and the optical element 204 may allow light to pass. The optical semiconductor device 202 and the optical component 204 are attached to opposite sides of the printed circuit board 106 in optical alignment with the aperture 402. Referring to FIG. 4, the optical semiconductor device 202 may be attached to the PCB surface 112, and the optical component 204 may be attached to the opposing side (PCB surface 110). The optical axis 406 of the optical component 204 is aligned with the aperture 402, and the active region 404 of the optical semiconductor device 202 is aligned along the same optical axis. The alignment of these components relative to the aperture 402 enables the passage of light between the semiconductor device 202 and an optical channel 302 (FIGS. 3 & 4) of the optical component 204.

For example, when implementing a TOSA, the optical semiconductor device 202 (e.g., a laser diode or LED) transmits light from one side of the printed circuit board 106, through the aperture 402 to the other side of the printed circuit board 106, and to the optical component 204. The optical component 204 focuses the light and provides it to a fiber ferrule connected to the TOSA via, for example, the port 104. When implementing a ROSA, the optical component 204 focuses light from the fiber ferrule and passes it from one side of the printed circuit board 106, through the aperture 402 to the other side, and to the optical semiconductor device 202.

Figure 9A:
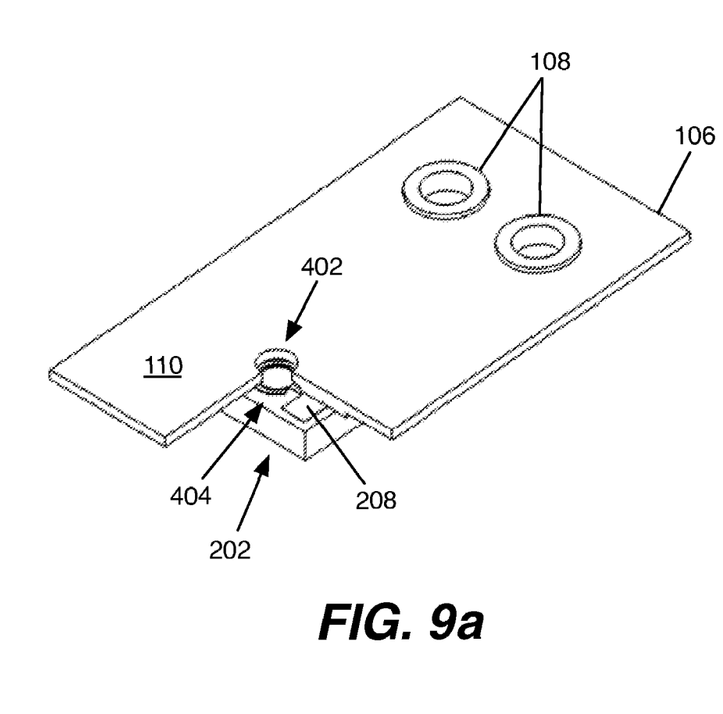
FIG. 9a is a perspective, partially-broken view of the upper surface of the printed circuit board.
Figure 9B:
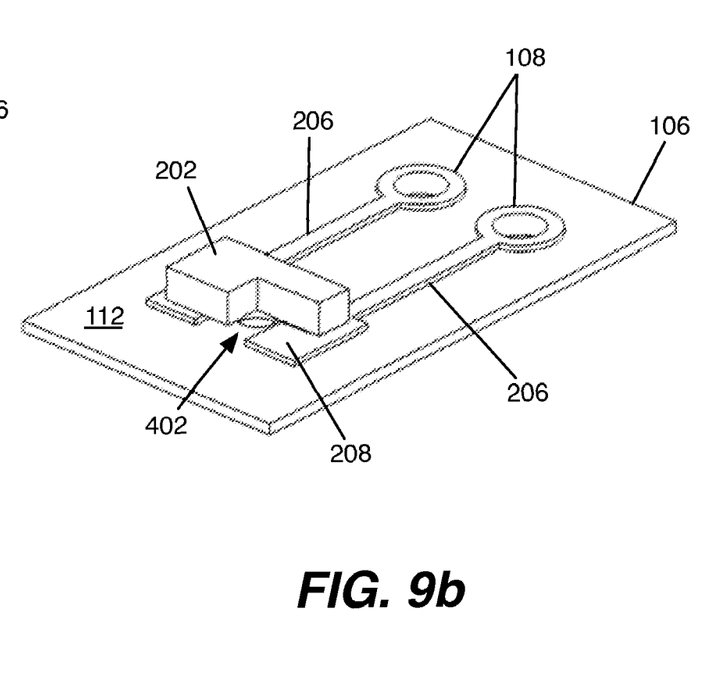
FIG. 9b is a perspective, partially-broken view of the lower surface of the printed circuit board.

FIGS. 9a & 9b illustrate the manner in which the optical subassembly 100 may interface with the electronic subassembly (not shown). The printed circuit board 106 may comprise traces 206 on the surface 112. The traces 206 electrically connect the pin through-holes 108 to the contact pads 208. As known in the art, the electronic subassembly may comprise a receiver integrated circuit and/or a transmitter integrated circuit that drives the optical semiconductor device 202. The integrated circuits on the electronic subassembly are connected to the through-holes (or other connectors) and, thereby, may interface with the TOSA and/or ROSA.

Figure 7:
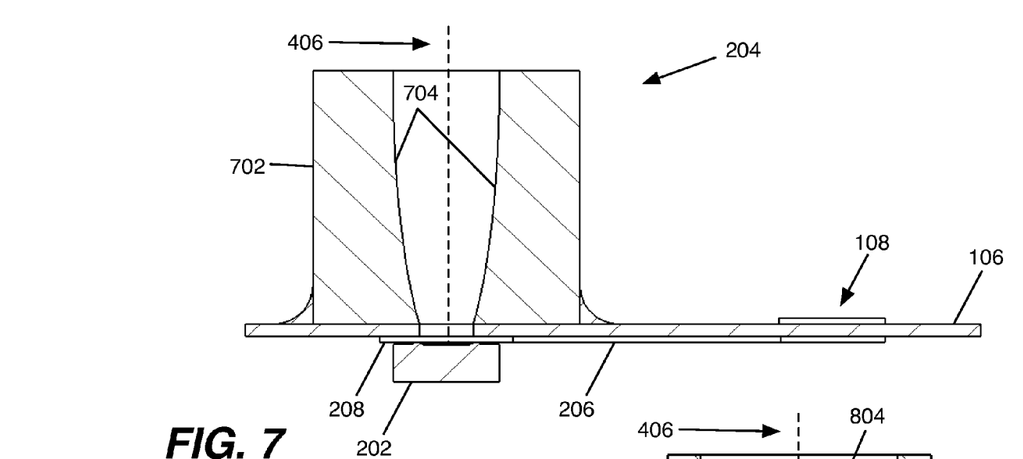
FIG. 7 is a cross-sectional side view of the optical subassembly of FIGS. 1 & 2 illustrating one embodiment of an optical element.
Figure 8:
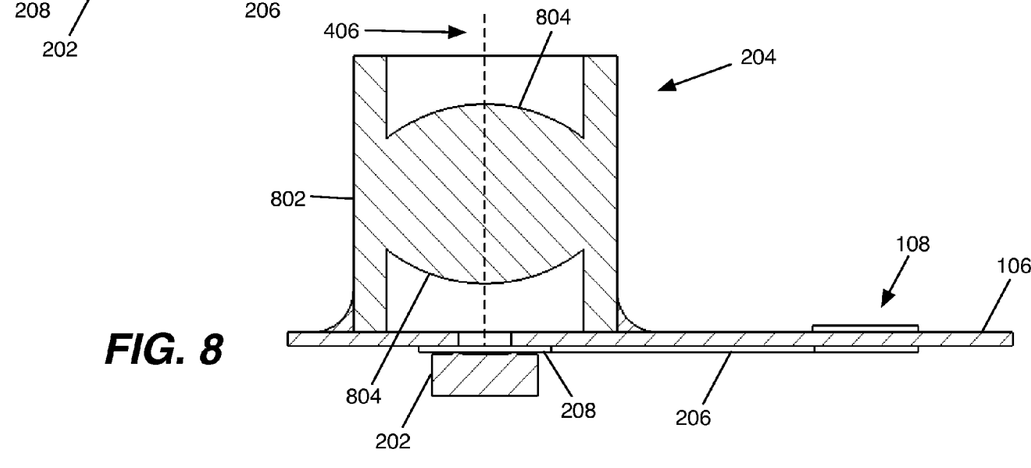
FIG. 8 is a cross-sectional side view of the optical subassembly of FIGS. 1 & 2 illustrating another embodiment of an optical element.

It should be appreciated that the optical component 204 generally comprises the optics for focusing the light to/from the fiber ferrule and the optical semiconductor device 202. Any desirable optics may be implemented. For example, in the embodiment illustrated in FIG. 8, the optical component 204 implements imaging optics, such as, for example, two optical surfaces 804 defined by a structure 802. In another embodiment as illustrated in FIG. 7, the optical component 204 implements non-imaging optics, such as, for example, a compound parabolic concentrator (CPC) 702 having, for example, a parabolic, cylindrical surface 704 for directing the light passing through. Regardless the optics employed, the optical component 204 may be attached to the surface 110 with the optical axis 406 aligned with the aperture 402.

Figure 5:
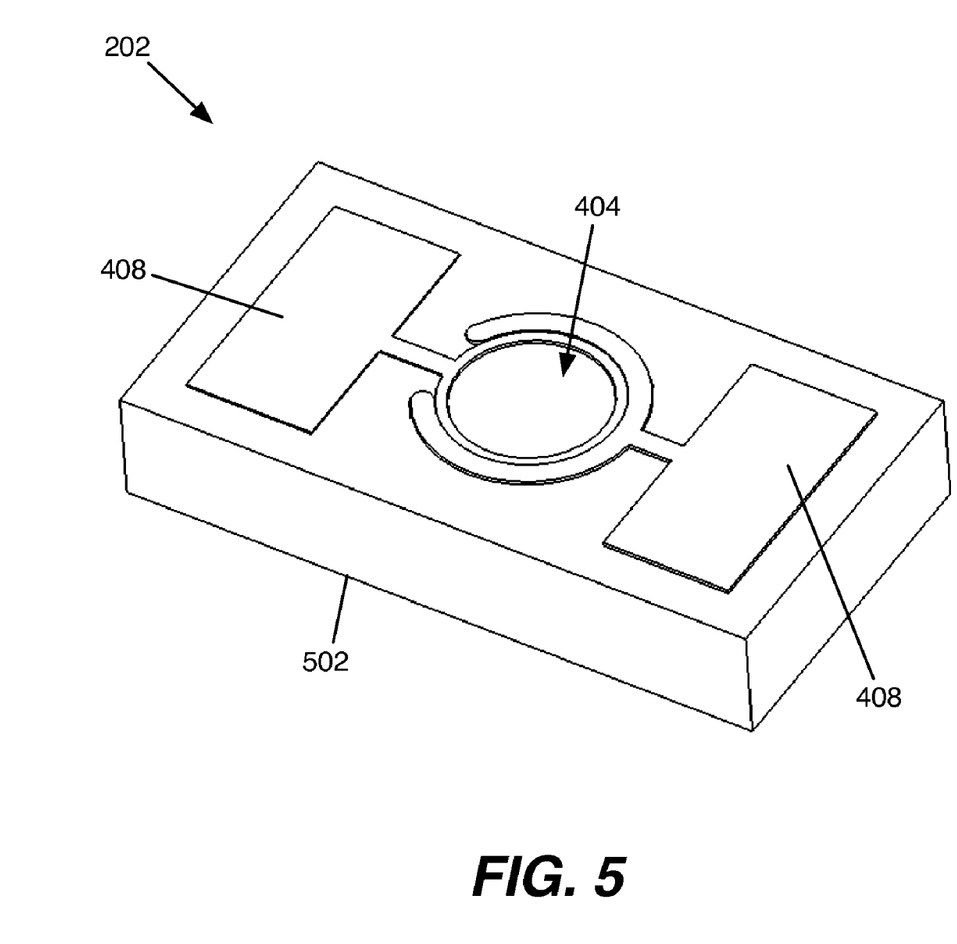
FIG. 5 is perspective view of one embodiment of an optical semiconductor device for connecting to one side of the printed circuit board.
Figure 6A:
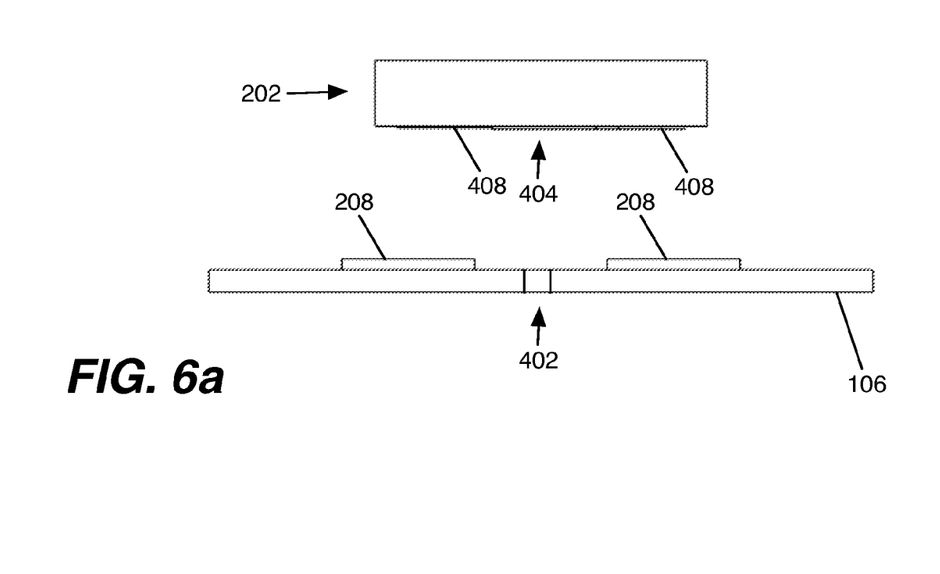
FIG. 6a is a side view illustrating the alignment of the semiconductor contacts with the contact pads of the printed circuit board.
Figure 6B:
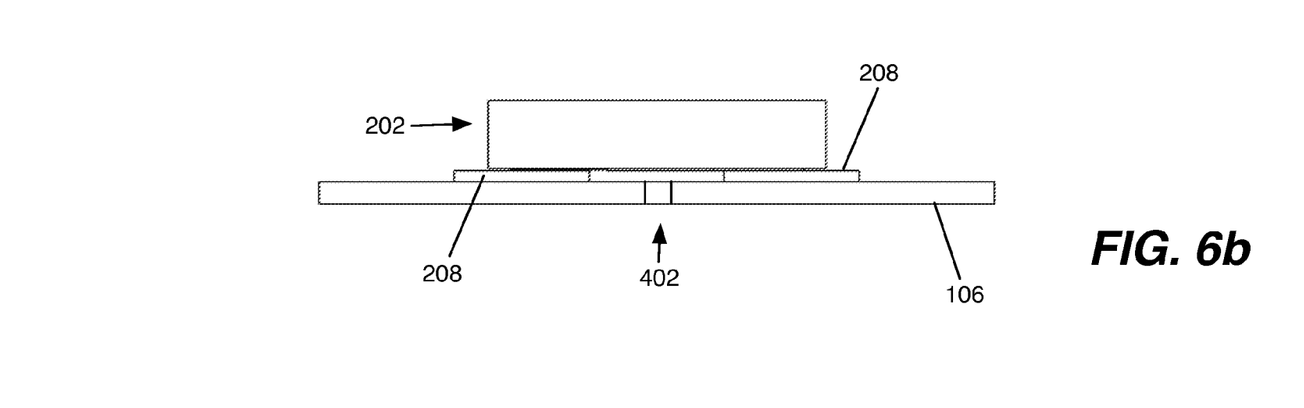
FIG. 6b illustrates the optical semiconductor device attached to the printed circuit board.

In one embodiment, as best illustrated in FIG. 5, the optical semiconductor device 202 may comprise a substrate 502, on one side of which are located a pair of semiconductor contacts, such as, for example, p-n electrode metalized contacts 408, and a corresponding active region 404 of the semiconductor device. Referring to FIGS. 6a & 6b, the optical semiconductor device 202 may be attached to the surface 112 via a die attach process. In one embodiment, the optical semiconductor device 202 may be placed in a tray with the active region 404 facing downward. A pick-up tool of a die placer device may pick up the substrate 502 by, for example, a vacuum suction means and then moved to a vision system. The pick-up tool aligns the center of the active region 404 to a pre-defined position and control die orientation. A gripper device of the die placer may move the PCB over the vision system to align the aperture 402 to the same pre-defined position. With the components aligned, the pick-up tool may lower and place the substrate 502 on the PCB. The contacts 408 may be attached to corresponding contact pads 208 on the printed circuit board 108. The contacts 408 and pads 208 are positioned relative to the aperture 402 such that, when the optical semiconductor device 202 and the printed circuit board 108 are attached, the active region 404 is aligned with the aperture 402. The contacts 408 and pads 208 may be soldered together via, for example, a standard reflow soldering process.

Figure 10:
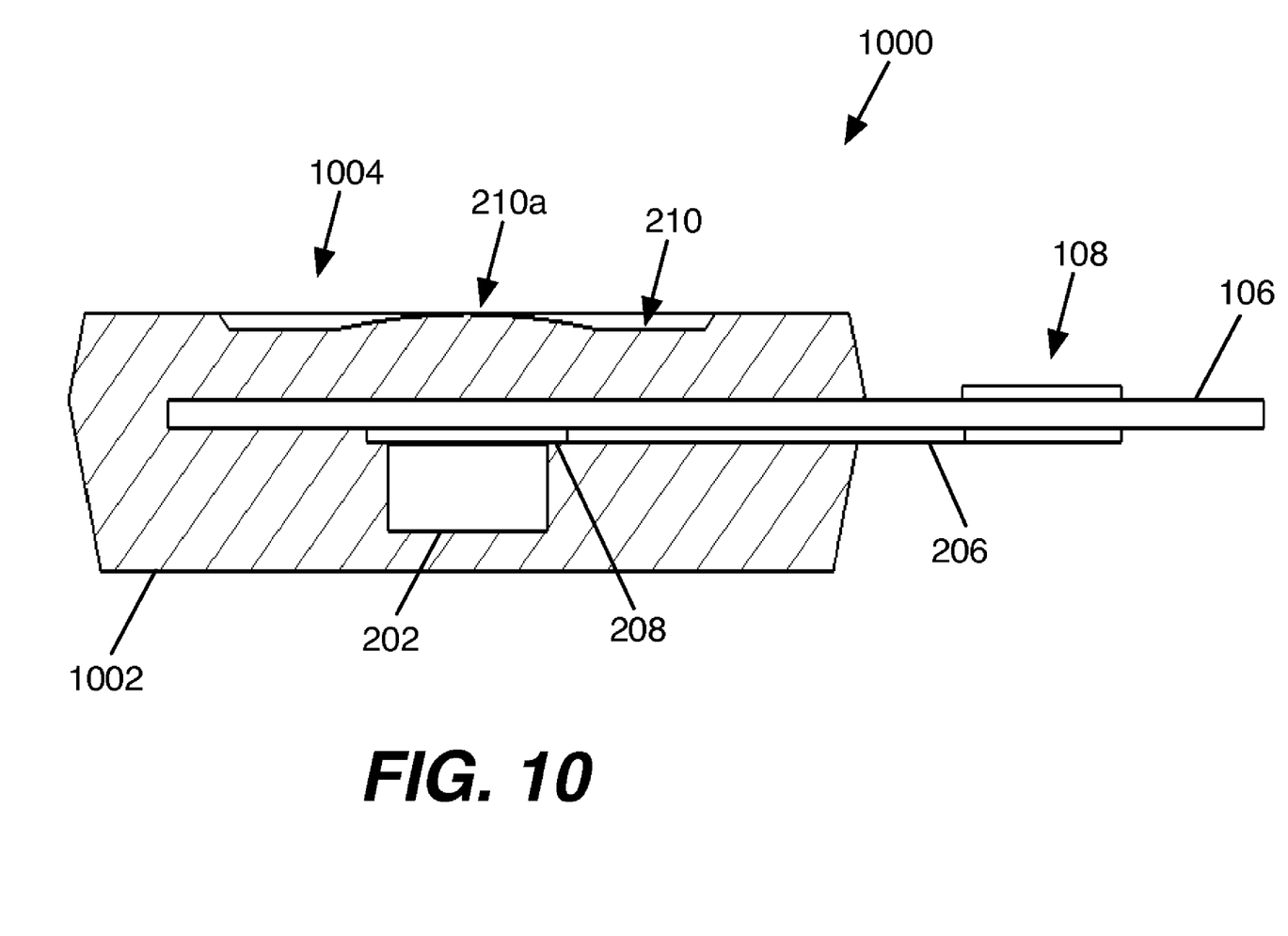
FIG. 10 is a cross-sectional side view of another embodiment of an optical subassembly, in which the optical element is overmolded to further reduce the size of the subassembly.

An alternative embodiment of an optical subassembly 1000 is illustrated in FIG. 10. In this embodiment, the size of the subassembly is further reduced by removing the optical component 204 from within the enclosure 1002. The enclosure 1002 forms a modular component 1002 that may receive a fiber ferrule via a port 1004. The optical subassembly 1000 may be configured in a similar manner as described above in connection with optical subassembly 100, with the exception of the removal of the optical component 204 and the configuration of the port 1004. The port 1004 may include a reference surface 210, as described above, as well as an additional reference surface 210a, such as, for example, a spherical or other surface that is integrated directly to the reference surface 210 as part of the enclosure 1002. The main function of the optical surface 210a is to improve coupling efficiency with the fiber ferrule.

Figure 11:
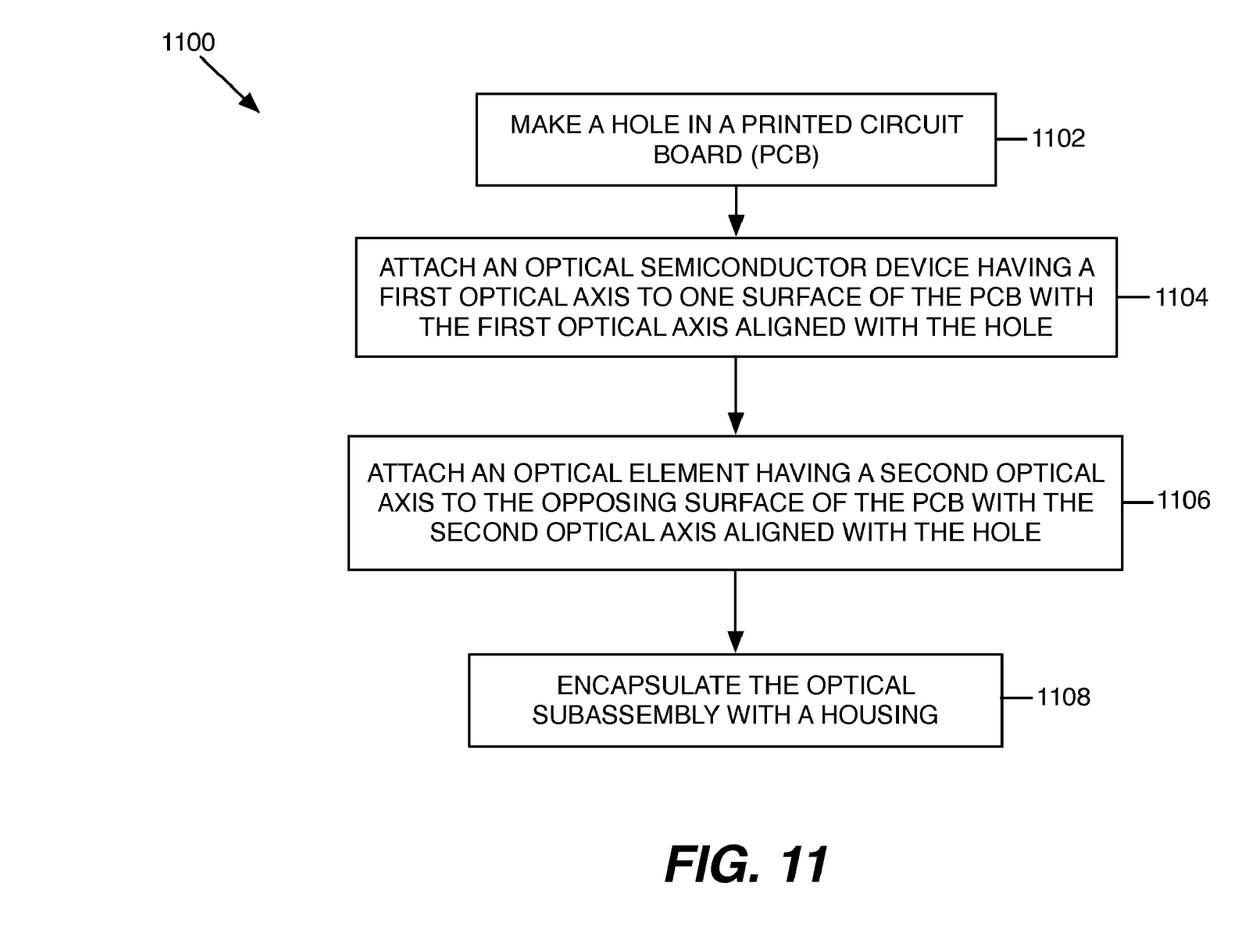
FIG. 11 is a flow chart illustrating one embodiment of a method for manufacturing an optical subassembly.

The unique designs described above for an optical subassembly may be manufactured in various ways. FIG. 11 illustrates one embodiment of a method 1100 for manufacturing the optical subassembly 100. At block 1102, a hole is made in the printed circuit board 106. At block 1104, the optical semiconductor device 202 is attached to one of the opposing surfaces of the printed circuit board 106. As described above, the p-n electrode metalized contacts 408 and the active region 404 may be positioned on the same surface of the substrate. In one embodiment, a die attach process is used to attach the contacts 408 on the PCB contact pads 208 with the active region 404 aligned with the aperture 402. At block 1106, the optical element 204 is attached to the other of the opposing surfaces of the printed circuit board 106. The optical axis 406 of the optical element 204 is aligned with the aperture 402. The optical element 204 may be attached in a number of desirable ways. In one embodiment, the optical element 204 may be attached to the printed circuit board 106 with an epoxy material. At block 1108, the optical assembly 100 is at least partially encapsulated with, for example, an optically clear polymer mold, although other suitable materials may be used for the enclosure 102.

One of ordinary skill in the art will appreciate that the unique designs described above may eliminate the need for wire bonding the optical semiconductor device 202 to the printed circuit board 106, and may reduce the package size, improve process yield, reduce manufacturing time, and reduce material costs. The printed circuit board 106 may also replace the need for using a lead frame to attach the optical semiconductor device 202. It should be further appreciated that the printed circuit board 106 may bond well with, for example, a polymer mold compound, as well as prevent the clear mold from cracking and delamination that may result from repeat thermal expansion.

It should be noted that this disclosure has been presented with reference to one or more exemplary or described embodiments for the purpose of demonstrating the principles and concepts of the invention. The invention is not limited to these embodiments. As will be understood by persons skilled in the art, in view of the description provided herein, many variations may be made to the embodiments described herein and all such variations are within the scope of the invention.

What is claimed is:

1. An optical subassembly for an electro-optical assembly, the optical subassembly comprising:
   a printed circuit board defining a planar structure having a first surface and a second surface opposing each other, and an aperture extending between the first and second surfaces;
   an optical semiconductor device attached to the first surface with an active region exposed to the aperture;
   an optical element attached to the second surface with an optical axis exposed to the aperture and optically aligned with the active region of the optical semiconductor device attached to the first surface;
   an enclosure at least partially encapsulating the optical element, the enclosure having a port optically aligned with the optical axis of the optical element and adapted to receive a fiber ferrule.

2. The optical subassembly of claim 1, wherein the optical semiconductor device comprises a light source.

3. The optical subassembly of claim 2, wherein the light source comprises one of a light emitting diode (LED) or a laser diode.

4. The optical subassembly of claim 1, wherein the optical semiconductor device comprises a photodiode.

5. The optical subassembly of claim 1, wherein the active region and corresponding electrical contacts are located on a same surface of the optical semiconductor device.

6. The optical subassembly of claim 5, wherein the printed circuit board comprises a pair of contact pads for connecting to the corresponding electrical contacts.

7. The optical subassembly of claim 1, wherein the printed circuit board comprises at least one through-hole for connecting to an electronic subassembly.

* * * * *